(12) United States Patent
Usa et al.

(10) Patent No.: US 7,141,356 B2
(45) Date of Patent: Nov. 28, 2006

(54) ELECTRON BEAM LITHOGRAPHY METHOD

(75) Inventors: Toshihiro Usa, Odawara (JP); Kazunori Komatsu, Odawara (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/169,575

(22) Filed: Jun. 30, 2005

(65) Prior Publication Data

US 2006/0001993 A1 Jan. 5, 2006

(30) Foreign Application Priority Data

Jun. 30, 2004 (JP) .............................. 2004-192700

(51) Int. Cl.
*G03C 5/00* (2006.01)
*G11B 7/00* (2006.01)

(52) U.S. Cl. .................. 430/296; 430/942; 369/44.13; 369/101

(58) Field of Classification Search ................ 430/296, 430/942; 369/44.13, 101
See application file for complete search history.

(56) References Cited

U.S. PATENT DOCUMENTS

| | | | |
|---|---|---|---|
| 6,735,163 B1 * | 5/2004 | Marshall | 369/126 |
| 6,930,961 B1 * | 8/2005 | Wada | 369/44.13 |
| 6,930,971 B1 * | 8/2005 | Marshall | 369/101 |
| 7,026,098 B1 * | 4/2006 | Komatsu et al. | 430/296 |
| 2002/0172130 A1 | 11/2002 | Wada | |
| 2003/0161222 A1 | 8/2003 | Komatsu et al. | |
| 2004/0057158 A1 | 3/2004 | Usa et al. | |
| 2004/0091817 A1 | 5/2004 | Komatsu et al. | |
| 2004/0240366 A1 * | 12/2004 | Tomita | 369/59.25 |

FOREIGN PATENT DOCUMENTS

| | | |
|---|---|---|
| EP | 1 339 059 A2 | 8/2003 |
| EP | 1 347 450 A2 | 9/2003 |
| EP | 1 418 576 A2 | 5/2004 |
| JP | 2001-110050 A | 4/2001 |
| JP | 2001-256644 A | 9/2001 |

* cited by examiner

*Primary Examiner*—Christopher G. Young
(74) *Attorney, Agent, or Firm*—Sughrue Mion, PLLC

(57) ABSTRACT

Deflecting means, for deflecting an electron beam in a radial direction and the circumferential direction, and blanking means, for shielding irradiation of the electron beam at portions other than drawing portions, are provided. While the disk is rotated unidirectionally, the electron beam is repeatedly deflected in a figure 8 pattern, in which the electron beam is deflected toward the next deflection initiation point in the radial direction at track edge portions, such that the deflected directions toward the inner periphery of the disk and toward the outer periphery of the disk intersect each other. Parallel scanning is performed alternately toward the outer periphery and the inner periphery of the disk. Elements of a transfer pattern, having lengths which are integer multiples of a reference value, are drawn by performing scanning a number of times equal to the integer that the reference value is multiplied by.

11 Claims, 3 Drawing Sheets

ELECTRON BEAM LITHOGRAPHY METHOD

BACKGROUND OF THE INVENTION

1. Field of the Invention

The present invention relates to an electron beam lithography method, for drawing and exposing elements that constitute an uneven transfer pattern on a master carrier for magnetic transfer, by irradiating an electron beam on a resist provided on a disk.

2. Description of the Related Art

A magnetic transfer method is known. In the magnetic transfer method, a master carrier for magnetic transfer that bears transfer data, formed by a fine uneven pattern of magnetic material, is placed in close contact with a slave medium, which has a magnetic recording portion. A transfer magnetic field is applied to the master carrier and the slave medium while they are in close contact with each other. Thereby, a magnetic pattern that corresponds to the data borne by the master carrier (servo signals, for example) is transferred and recorded on the slave medium.

As a method to produce master carriers, which are utilized in magnetic transfer, an application of an optical disk stamper production method is being considered (refer to Japanese Unexamined Patent Publication No. 2001-256644, for example). The optical disk stamper production method uses an original disk, having an uneven pattern formed of resist that corresponds to data to be transferred, as a base.

During production of the optical disk stamper, a disk (a glass plate, for example) having resist coated thereon is rotated. Data is converted to lengths of pits, and data is written into the resist by emitting laser beams, which are modulated according to the lengths of pits, onto the resist.

It is considered that drawing of the fine patterns onto master carriers for magnetic transfer may also be performed by rotating a disk having resist coated thereon and emitting a laser beam modulated according to data to be transferred, similar to the production method for the optical disk stamper.

However, miniaturization and increase of data capacity are desired in magnetic disk media. If bit lengths or track widths are decreased to accommodate increases in recording density (for example, if bit lengths or track widths become 0.3 μm or less), the decreased sizes approach the drawing limits of laser beams. Therefore, the shapes of the ends of drawn portions become arcuate, causing difficulty in forming rectangular elements of the uneven patterns. The shapes of the elements that constitute the uneven patterns of master carriers, and particularly the shapes of the upper surfaces of the elements, are those of the drawn portions. Therefore, if the ends of the drawn portions are arcuate, the upper surfaces of the protrusions of the uneven patterns on the master carrier substrate become shapes different from rectangles, such as ovals. In these cases, it becomes difficult to form desired magnetic patterns on slave media.

Meanwhile, in the field of semiconductors, patterning is already being performed by utilizing electron beams, which are capable of exposure with smaller diameter spots than laser beams. By utilizing the electron beams, it is becoming possible to perform highly accurate patterning of fine patterns.

In addition, patterned exposure using electron beams has been proposed in Japanese Unexamined Patent Publication No. 2001-110050. The patterned exposure using electron beams has been proposed to produce miniature, light weight and high recording density magnetic patterned media, the realization of which is being anticipated.

Magnetic transfer has a conspicuous advantage over conventional servo track writers when recording servo patterns that correspond to servo signal as transfer patterns. Conventional servo track writers require a long amount of time to record servo patterns in each sector of circumferential tracks using magnetic heads. In contrast, magnetic transfer is capable of simultaneously recording the servo patterns across the entire surface of a disk in a short amount of time.

However, servo signals include, for example: synchronization signals (preambles) which are recorded across the entire width of a track; address signals (gray code) such as track numbers; and burst signals for positioning heads, which are recorded across half of the width of a track. In addition, the address signals are not limited to single unit signals (1 bit signals), but include multiple unit signals (multiple bit signals). Similarly, a transfer pattern (uneven pattern formed on magnetic material), to be formed on a master carrier for magnetic transfer in order to transfer and record the servo signals, comprises elements which are of lengths that are of a reference value, corresponding to a single bit, and integer multiples of the reference value, corresponding to multiple bits. It is necessary to efficiently and accurately draw the elements, which are of varying lengths in the circumferential direction, in a resist layer provided on a disk, using an electron beam.

In addition, it is necessary for concentric patterning to be performed to produce the master carriers for magnetic transfer. Therefore, favorable pattern formation is difficult, in the case that an electron beam lithography method that employs an XY stage, as in the field of semiconductors, is adopted. Accordingly, an electron beam lithography method, which is capable of drawing patterns favorable for master carriers, is desired. Accompanying increases in the numbers of tracks (numbers of sectors), the number of elements also becomes enormous. Thus, reductions in drawing times, by improvements in drawing speeds, as well as improvements in the shapes and positional accuracy of drawn elements across the entire surfaces of disks, are desired.

Particularly in the case that the elements are drawn employing lithography, elements are drawn by rotating a disk and deflecting an electron beam in the radial and circumferential directions thereof, for a single circumferential track. However, if lithography is performed in a single radial direction, time is required to return the electron beam in the radial direction opposite the drawing direction, after deflecting the electron beam in the radial direction to draw a single unit of a multiple bit element. During this time, lithography is not possible, thereby creating blank periods between lithography of a first unit and lithography of a next unit. Accordingly, there is a problem that continuous elements, which are long in the circumferential direction, cannot be drawn. Drawing a single track during multiple rotations of the disk reduces drawing efficiency, and also causes difficulties in securing positional accuracy for drawn elements.

SUMMARY OF THE INVENTION

The present invention has been developed in view of the circumstances described above. It is an object of the present invention to provide an electron beam lithography method, which is capable of drawing transfer patterns comprising elements having different lengths in the circumferential direction on circumferential tracks of disks, highly accurately and at high speeds.

The electron beam lithography method of the present invention is an electron beam lithography method, for drawing elements that constitute a transfer pattern of a master carrier for magnetic transfer, by: placing a disk, which has resist coated thereon, on a rotatable stage, which is also movable in the radial direction thereof; rotating the rotatable stage; and scanning an electron beam emitted from an electron beam lithography apparatus; characterized by:

the transfer pattern comprising elements, which are formed within transfer regions of each sector of concentrically formed circumferential tracks and which have lengths in the circumferential direction that are integer multiples of a reference value;

the electron beam lithography apparatus comprising: deflecting means, for deflecting the emitted electron beam in the radial direction of the disk and also in the circumferential direction substantially perpendicular to the radial direction; and blanking means for shielding irradiation of the electron beam onto portions other than drawing portions;

the electron beam lithography method comprising the steps of:

unidirectionally rotating the disk;

repeating deflection of the electron beam in a figure 8 pattern, in which the electron beam is deflected toward the next deflection initiation point in the radial direction at track edge portions, such that the deflected directions toward the inner periphery of the disk and toward the outer periphery of the disk intersect each other;

scanning the electron beam alternately at the inner peripheral portion and the outer peripheral portion of the rotating disk at a pitch equal to the reference value;

emitting the electron beam while operating the blanking means during deflection of the electron beam at the portions of the disk where the elements are drawn; and drawing the elements, which have lengths that are integer multiples of a reference value, by scanning the electron beam in the radial direction a number of times equal to the integer that the reference value is multiplied by.

It is preferable that deflection of the electron beam in the radial direction is performed to be greater than a track width; and deflection in the circumferential direction toward the radial direction to the next deflection initiation point is performed at a track edge portion outside the track width.

The angle between the deflection direction of the electron beam toward the outer peripheral direction and the deflection direction toward the inner peripheral direction is set according to the rotating speed of the disk, the angle of inclination of the element, and a drawing speed.

In the present invention, it is preferable that the reference value of the drawing length in the circumferential direction of the elements is defined by an oscillation width of the electron beam, when reciprocally oscillating the electron beam at high speed in the circumferential direction, which is substantially perpendicular to the radial direction of the disk.

The present invention is favorably applicable to cases in which the transfer pattern is a servo pattern that includes address portions.

The "elements that constitute a transfer pattern" are recording elements, which are formed to record signals that correspond to data in tracks. The elements are generally parallelograms, which include rectangular shapes, and are surrounded by sides, which are parallel to the track direction, and sides, which intersect the track direction either perpendicularly or at an angle.

An electron beam lithography apparatus for executing the lithography method of the present invention comprises: a rotatable stage, for rotatably holding a disk; a mechanism for linearly moving the rotatable stage; means for drive controlling the rotational speed of the rotatable stage and the linear motion thereof; an electron beam emitting means, for generating and emitting electron beams; blanking means, for switching the irradiation of electron beams on/off; deflecting means, for deflecting electron beams in the circumferential and radial directions; means for transmitting lithography data signals that cause electron beams to be scanned according to each element of a pattern; and control means for coordinating and controlling the operations of the aforementioned components.

According to the electron beam lithography method of the present invention, elements that have lengths in the circumferential direction, which are integer multiples of a reference value, are drawn by: unidirectionally rotating the disk; repeating deflection of the electron beam in a figure 8 pattern, in which the electron beam is deflected toward the next deflection initiation point in the radial direction at track edge portions, such that the deflected directions toward the inner periphery of the disk and toward the outer periphery of the disk intersect each other; scanning the electron beam alternately at the inner peripheral portion and the outer peripheral portion of the rotating disk at a pitch equal to the reference value; emitting the electron beam while operating the blanking means during deflection of the electron beam at the portions of the disk where the elements are drawn; and drawing the elements, which have lengths that are integer multiples of a reference value, by scanning the electron beam in the radial direction a number of times equal to the integer that the reference value is multiplied by. Therefore, elements having different lengths in the circumferential direction of a single track can be drawn in one rotation of the disk, without creating blank periods between lithography. In addition, fine patterns can be formed on the entire surface of the disk at high speed and with high accuracy. Accordingly, the drawing efficiency is improved, and the time required for lithography can be shortened.

Further, deflection of the electron beam in the radial direction may be performed to be greater than a track width; and deflection in the circumferential direction toward the radial direction to the next deflection initiation point may be performed at a track edge portion outside the track width. In this case, elements, which are long in the circumferential direction, can be drawn more accurately.

BRIEF DESCRIPTION OF THE DRAWINGS

FIGS. 4A and 4B illustrate an embodiment of an electron beam lithography apparatus for executing the electron beam lithography method of the present invention, wherein FIG. 4A is a side view of the main parts thereof, and FIG. 4B is a plan view.

DESCRIPTION OF THE PREFERRED EMBODIMENTS

Figure 1A:
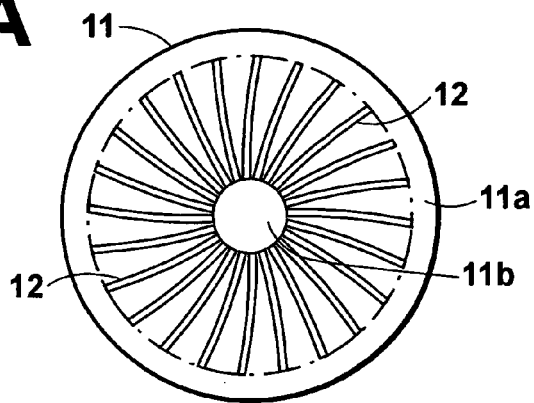
FIG. 1A is a plan view of a transfer pattern to be drawn on a master carrier for magnetic transfer by the electron beam lithography method of the present invention.
Figure 1B:
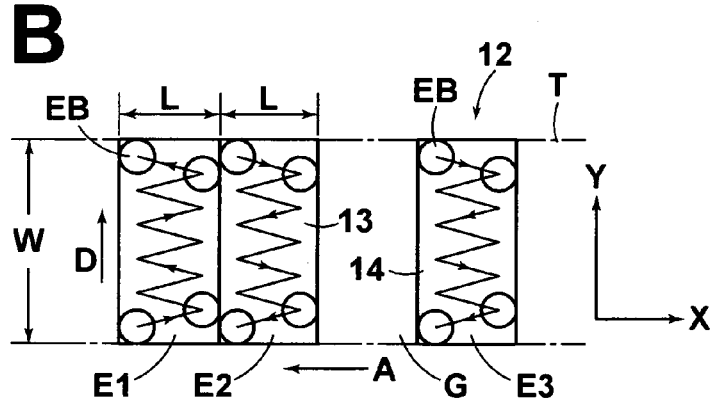
FIG. 1B is an enlarged schematic view of a basic lithography method for drawing elements that constitute the transfer pattern.
Figure 2A:
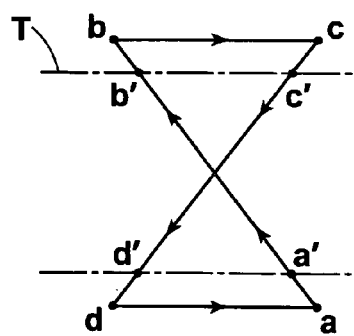
FIG. 2A illustrates deflection operations of an electron beam according to an embodiment of the present invention.
Figure 2B:
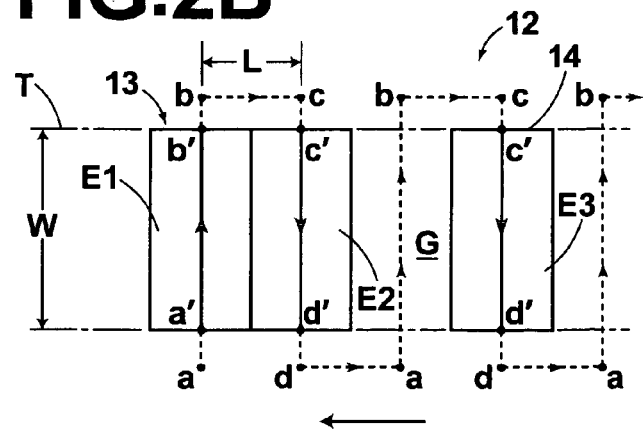
FIG. 2B illustrates beam scanning of elements on a rotating disk.
Figure 3A:
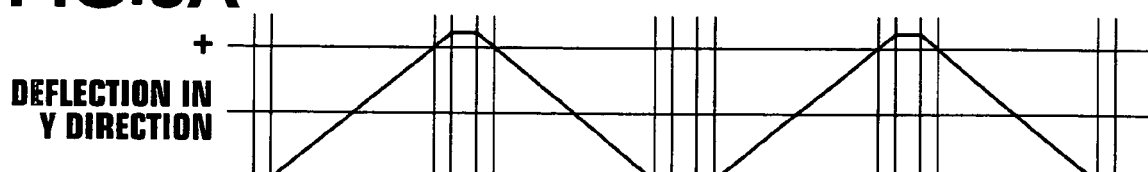
FIGS. 3A, 3B, and 3C are diagrams that respectively illustrate deflection amounts in each direction and blanking signals, of the embodiment of FIGS. 2A and 2B.
Figure 3B:
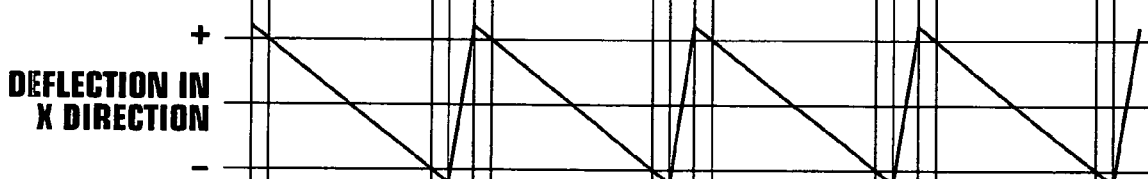
Figure 3C:
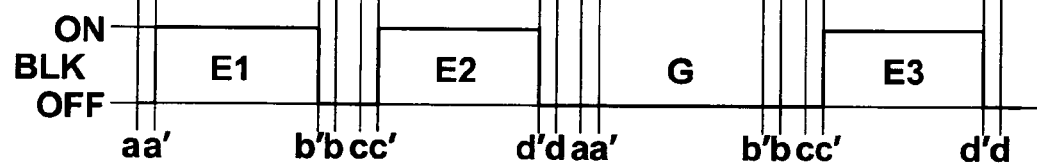
Figure 4A:
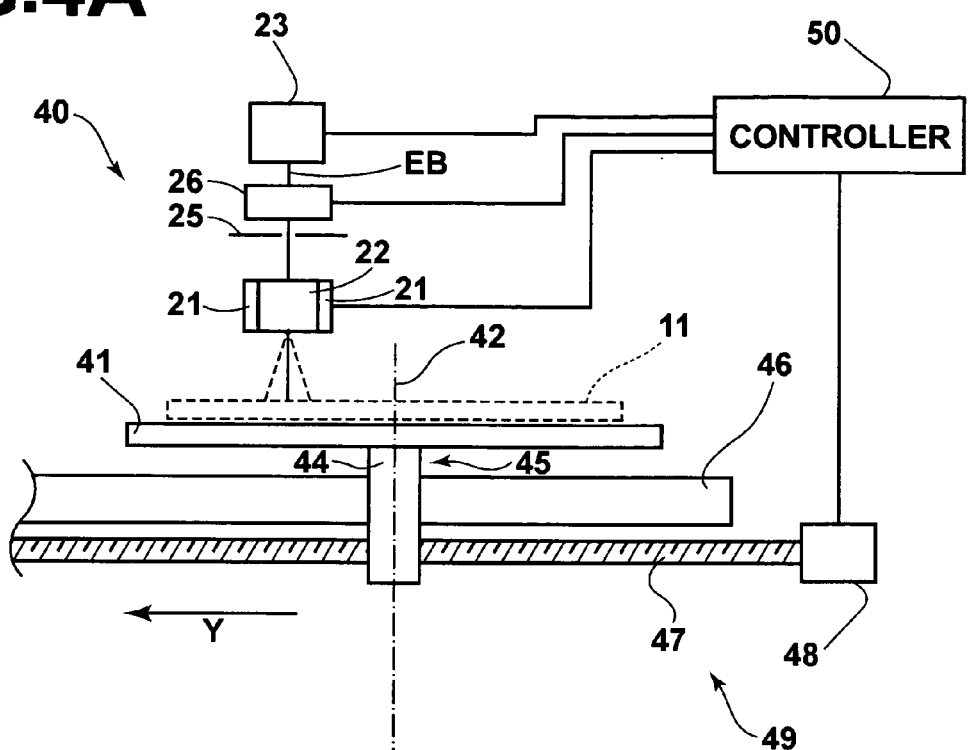
Figure 4B:
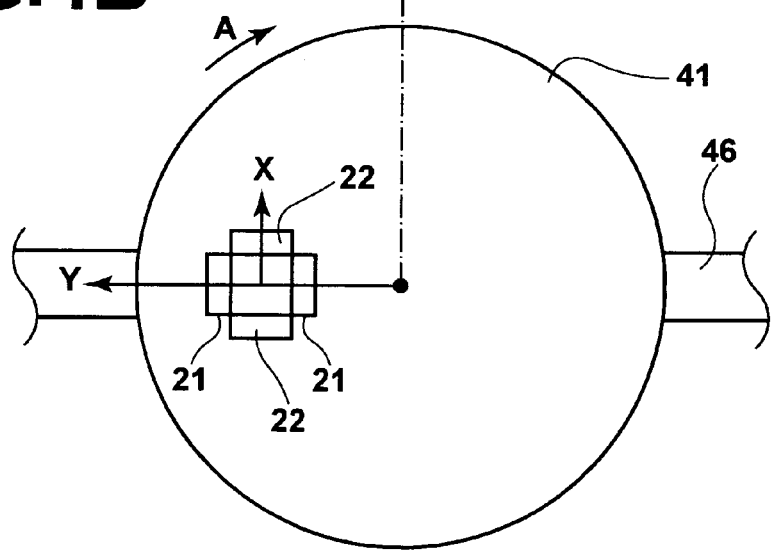

Hereinafter, a preferred embodiment of the present invention will be described in detail with reference to the attached drawings. FIG. 1A is a plan view of a transfer pattern to be drawn on a master carrier for magnetic transfer by the electron beam lithography method of the present invention. FIG. 1B is an enlarged schematic view of a basic lithography method for drawing elements that constitute the transfer pattern. FIG. 2A illustrates deflection operations of an electron beam according to an embodiment of the present invention. FIG. 2B illustrates beam scanning of elements on a rotating disk. FIGS. 3A, 3B, and 3C are diagrams that respectively illustrate deflection amounts in each direction and blanking signals, of the embodiment of FIGS. 2A and 2B. FIGS. 4A and 4B illustrate an embodiment of an electron beam lithography apparatus for executing the electron beam lithography method of the present invention, wherein FIG. 4A is a side view of the main parts thereof, and FIG. 4B is a plan view.

As illustrated in FIG. 1A, a transfer pattern 12 (servo pattern) constituted by fine protrusions and recesses, which is formed on a master carrier for magnetic transfer, is formed in an annular region of a discoid disk 11 (discoid substrate) that excludes an outer peripheral portion 11a and an inner peripheral portion 11b. The pattern 12 in FIG. 1A illustrates a case in which transfer data is servo signals. The servo signals are formed in thin regions that extend substantially radially from the central portion of the disk 11, such that they are positioned at equidistant intervals along concentric tracks of the disk 11 and within transfer regions of each sector. Note that in the servo pattern 12 of this example, the servo signals are formed in arcuate radial regions, which are continuous in the radial direction.

FIG. 1B is an enlarged view of a portion of the pattern 12. As illustrated in FIG. 1B, fine elements (a first element 13 and a second element 14 in FIG. 1B) that correspond to data to be transferred (address data, for example) are provided in concentric tracks T. The pattern 12 is constituted by clusters of these and other elements (not shown). The first element 13 is a rectangle having a width W that corresponds to the track width, and a circumferential length (bit length) of 2L (2 bits). The second element 14 is a rectangle having a width W and a circumferential length of L (1 bit). The length of the second element 14 is equal to a reference value L, and the length of the first element 13 is twice the reference value L. A blank portion G between the first element 13 and the second element 14 is also formed to have a circumferential length of L or an integer multiple thereof. As will be described later, the first element 13 is drawn by two scans E1 and E2 in the radial direction (track width direction), and the second element 14 is drawn by a single scan E1. The elements 13 and 14 will become protrusions (or recesses) in a final master carrier, and other portions will become flat portions.

Lithography of each of the elements 13 and 14 of the pattern 12 is performed by placing the disk 11, which has resist coated on the surface thereof, on a rotatable stage 41 (refer to FIG. 4) and rotating the stage 41. While the disk 11 is being rotated, an electron beam EB scans the elements 13 and 14 to irradiate and expose the resist one track at a time, from the inner tracks toward the outer tracks, or in the opposite direction.

FIGS. 1B, 2A, 2B, 3A, 3B, and 3C illustrate the embodiment of the electron beam lithography method of the present invention. Lithography in this embodiment is that in which elements of a single track, such as the first and second elements 13 and 14, which have different lengths in the circumferential direction, are drawn in a single rotation of the disk 11. The fine diameter electron beam EB continuously scans the shapes of the first and second elements 13 and 14 so as to fill in the shapes, while the disk 11 is rotated in direction A. Scanning is performed at predetermined phase positions of the concentric tracks T (track width: W), which extend in a circumferential direction X perpendicular to a radial direction Y, when viewed microscopically. In this manner, all of the elements of a single track are drawn within a single rotation of the disk 11.

The scanning is performed by emitting the electron beam EB, which has a smaller beam diameter than the minimum width of the elements 13 and 14, with ON/OFF operations according to drawing positions, performed by blanking means (aperture member 25, blank 26) to be described later. The electron beam EB is deflected in the radial direction Y and the circumferential direction X according to the rotating speed of the disk 11, to perform deflection D across the track width W. The electron beam EB is also reciprocally oscillated in the circumferential direction X, which is substantially perpendicular to the radial direction Y, at a uniform oscillation width L, as illustrated in FIG. 1B, to perform exposure lithography.

FIG. 2A illustrates deflection operations of the electron beam EB, in the radial direction Y and the circumferential direction X, excluding the reciprocal oscillation. That is, FIG. 2A illustrates the trajectory of the electron beam EB with respect to the disk 11, which is stationary. FIG. 2B illustrates the trajectory of the electron beam EB along the track T of the disk 11, which is rotated in direction A, excluding the reciprocal oscillation. FIG. 3A illustrates displacement properties of the electron beam EB in the radial direction Y with respect to time (movement of the track), which is the horizontal axis. FIG. 3B illustrates displacement properties of the electron beam EB in the circumferential direction X with respect to time. FIG. 3C illustrates the ON/OFF operations of a blanking signal BLK.

First, the deflection operations of the electron beam EB in the radial direction Y and the circumferential direction X cause the electron beam EB to be repeatedly deflected in a figure 8 pattern, in which deflection toward the outer periphery and deflection toward the inner periphery of the disk 11 intersect. Thereby, the deflection paths of the electron beam EB with respect to the disk 11, which is rotating in the direction A, become those illustrated in FIG. 2B. That is, the electron beam EB is alternately scanned toward the outer periphery and toward the inner periphery. The scanning toward the outer periphery and the scanning toward the inner periphery are performed parallel to each other. The electron beam EB is emitted a number of times equal to an integer by an ON operation of the blanking means. The shape of the first element 13 is drawn by two scans E1 and E2, and the shape of the second element 14 is drawn by a single scan E3. The deflection width in the radial direction Y is set to be greater than the track width W.

The figure 8 deflection pattern is performed by deflecting the electron beam EB from point a, which is outside the track T toward the inner periphery, toward the outer periphery in the radial direction X, while simultaneously deflecting the electron beam EB in the circumferential direction X toward the rotating direction A, at the same speed as the rotation of the disk 11. At point a', the electron beam EB is positioned at the lower edge of the track T, and at point b', the electron beam EB is positioned at the upper edge of the track T. The electron beam EB is deflected further to a point b, which is outside the track T toward the outer periphery. The electron beam EB is scanned from point a to point b so as to cross the track T perpendicularly with respect to the rotating disk 11. Half of the first element 13 is drawn by emission of the electron beam EB from point a' to point b', and by reciprocal oscillation thereof.

Next, the electron beam EB is deflected in the circumferential direction X opposite the rotating direction A, from point b to point c. Thereby, movement in the track direction for the reference value L (pitch) on the disk 11 is performed.

Then, the electron beam EB is deflected toward the inner periphery from point c, which is outside the track T toward the outer periphery, to a point d, which is outside the track T toward the inner periphery. At the same time, the electron beam EB is deflected in the circumferential direction X toward the rotating direction A at the same speed as the rotating speed of the disk 11. At point c', the electron beam EB is positioned at the upper edge of the track T, and at point d', the electron beam EB is positioned at the lower edge of the track T. The deflection toward the inner periphery from point c to point d intersects the deflection toward the outer periphery from point a to point b. The electron beam EB is scanned from point c to point d so as to cross the track T perpendicularly with respect to the rotating disk 11. The remaining half of the first element 13 is drawn by emission of the electron beam EB from point c' to point d', and by reciprocal oscillation thereof, which is exposure scanning E2.

Next, the electron beam EB is deflected at high speed from point d to point a, in the circumferential direction X opposite the rotating direction A. Thereby, movement in the track direction for the reference value L is performed with respect to the disk 11. By repeating the deflection operations in the figure 8 pattern, alternate and parallel scanning of the electron beam EB is performed toward the outer periphery and toward the inner periphery, at a pitch equal to the reference value L.

The blanking means shields emission of the electron beam EB at the blank portion G. That is, deflection signals are output, but exposure is not performed at the blank portion G.

As illustrated in FIG. 3A, deflection of the electron beam EB in the radial direction Y, of the deflection operations in the figure 8 pattern, is performed linearly from point a to point b, toward the outer periphery. Deflection is maintained between point b and point c. Then, the electron beam EB is linearly deflected toward the inner periphery from point c to point d. Deflection is maintained between point d and point a. The above deflection operations are repeated.

As illustrated in FIG. 3B, deflection of the electron beam EB in the circumferential direction X, of the deflection operations in the FIG. 8 pattern, is performed linearly from point a to point b in a direction opposite the rotating direction A. The electron beam EB is deflected at high speed from point b to point c in the rotating direction A. The electron beam EB is then deflected linearly from point c to point d in the direction opposite the rotating direction A, then deflected at high speed from point d to point a in the rotating direction A. The above deflection operations are repeated.

Further, the blanking signal BLK that turns irradiation of the electron beam EB ON/OFF is operated such that the irradiation is turned ON between points a' and b' or between points c' and d' during exposure scanning operations E1, E2, and E3. Irradiation of the electron beam EB is turned OFF, that is, shielded, at the blank portion G and at positions outside the track T.

The elements 13 and 14 having widths of desired integer multiples of the reference value L can be drawn, by the deflection operations in the figure 8 pattern and the ON/OFF operations of the blanking means described above. The above described operations also enable drawing of blank portions G, which have width of desired integer multiples of the reference value L. The operations are expedited by the simplicity of the deflection control, which improves drawing speed.

Particularly, by performing deflection to return the electron beam EB in the circumferential direction X outside of the track T, no blanks are formed in the unit scanning operations E1 and E2, thereby enabling continuous lithography of the element 13. Note that the distance of deflection in the radial direction Y outside the track T varies according to the rotating speed of the disk 11, the deflection speed of the electron beam EB, and the oscillation width of the reciprocal oscillation of the electron beam EB. Due to this variance, there are cases in which OFF operations of the blanking means are unnecessary during scanning of a single element, such as during scanning operations E1 and E2.

In addition, the angle of intersection between the deflection toward the outer periphery a-b and the deflection toward the inner periphery c–d is set according to the rotating speed of the disk 11, the angle of inclination of the elements 13 and 14, and the drawing speed. That is, in the embodiment illustrated in FIGS. 1B, 2A, and 2B, the front and rear edges of the elements 13 and 14 are perpendicular to the track direction. However, in the case that an element in the shape of an inclined parallelogram is to be drawn, the deflection angles of the a–b deflection and the c–d deflection are different from those in the above embodiment. If the drawing speed is uniform and the rotating speed of the disk 11 is increased, the amount of deflection in the circumferential direction X also increases. If the rotating speed of the disk 11 is uniform and the drawing speed is increased, the amount of deflection in the circumferential direction X decreases.

The desired pattern 12 is drawn across the entire pattern region of the disk 11, by moving the electron beam EB to a next track T, after a track T is drawn in a single rotation. Movement of the electron beam EB to the next track T is performed by linearly moving the rotatable stage 41, to be described later, in the radial direction Y. This movement may be performed every time a track is drawn, or every time a plurality of tracks are drawn, depending on a deflectable range of the electron beam EB in the radial direction Y. In addition, the reference value L, for the drawing lengths of the elements 13 and 14 in the circumferential direction X, is determined by the oscillation width of the reciprocal oscillation of the electron beam EB in the circumferential direction X.

The rotating speed of the rotatable stage 41 is adjusted such that rotation is slower when lithography is being performed at the outer peripheral positions of the disk 11, and faster when lithography is being performed at the inner peripheral portions of the disk 11. This is to ensure that the linear speed of the electron beam EB is constant, regardless of the movement in the radial position of drawing portions within the drawing region of the disk 11, that is, movement of the electron beam EB to the next track. This configuration is preferable, because the constant linear speed of the electron beam EB enables uniform exposure at all drawn portions of the disk, and also because accuracy in the drawing positions can also be improved.

The electron beam EB is scanned as described above, to draw the elements 13 and 14. Lithography data signals, for controlling scanning of the electron beam EB, are transmitted. The transmitted signals control timing and phase, based on reference clock signals, which are generated according to the rotating speed of the rotatable stage 41.

There are cases in which the recording method of the pattern 12 is the CAV (Constant Angluar Velocity) method. In these cases, the lengths of sectors are different between outer tracks and inner tracks. Therefore, the reference value L of the elements 13 and 14 are set to be greater at the outer tracks and smaller at the inner tracks. When drawing these elements 13 and 14, the speed of deflection D in the radial direction Y is changed such that it is slower at the outer tracks, and faster at the inner tracks. That is, the deflection speed is varied such that it is caused to be slower the further the drawing portion is from the rotational center of the disk 11. Thereby, the lithography area by the electron beam EB is caused to be uniform per unit time for each of the elements 13 and 14. Accordingly, exposure of the elements 13 and 14 can be performed evenly, under the same conditions. In other words, exposure can be performed under stable conditions, in which the frequency of reciprocal oscillation of the electron beam EB in the circumferential direction X and the electron beam intensity are uniform.

An electron beam lithography apparatus 40, such as that illustrated in FIGS. 4A and 4B, is utilized to perform lithography as described above. The electron beam lithography apparatus 40 comprises: a rotatable stage unit 45; a shaft 46; and a linear movement means 49. The rotatable stage unit 45 comprises: the rotatable stage 41 for holding the disk 11; a central shaft 42 of the rotatable stage 41; and a spindle motor 44, which has a motor shaft provided to match the central shaft 42 of the stage 41. The shaft 46 penetrates through a portion of the rotatable stage unit 45, and extends in the radial direction Y of the rotatable stage 41. The linear movement means 49 moves the rotatable stage unit 45 along the shaft 46. A rod 47, having fine threads engraved therein, is provided parallel to the shaft 46. The rod 47 is in threaded engagement with a portion of the rotatable stage unit 45. The rod 47 is rotated in two directions by a pulse motor 48. The linear movement means 49, for moving the rotatable stage unit 45, is constituted by the rod 47 and the pulse motor 48. In addition, means (not shown), for generating the reference clock signals corresponding to the rotation of the rotatable stage 41, is provided.

The electron beam lithography apparatus 40 further comprises: an electron gun 23, for emitting the electron beam EB; deflecting means 21 and 22, for deflecting the electron beam EB in the Y direction (radial direction of the disk) and in the X direction (circumferential direction) perpendicular to the Y direction; and the aperture member 25 and the blank 26 (deflector) that constitute the blanking means, for turning the irradiation of the electron beam EB ON/OFF. The electron beam EB, which is emitted from the electron gun 23, is irradiated onto the disk 11 via the deflecting means 21, 22, and lenses (not shown). Note that during pattern lithography, the deflecting means 21 and 22 are controlled to cause the electron beam EB to reciprocally oscillate in the circumferential direction X, at a uniform oscillation width.

The aperture member 25 of the blanking means is provided with a transparent aperture for the electron beam EB to pass through at its central portion. The blank 26 (deflector) does not deflect the electron beam EB, thereby causing it to pass through the transparent aperture of the aperture member 25 if an ON signal is input. On the other hand, if an OFF signal is input, the blank 26 deflects the electron beam EB so that it does not pass through the transparent aperture, but is shielded by the aperture member 25. When the elements 13 and 14 are being drawn, an ON signal is input to irradiate the electron beam EB, and an OFF signal is input when moving between the elements 13 and 14, to shield the electron beam EB such that exposure is not performed. The blanking means is employed to draw the first and second elements 13 and 14, as described above.

The driving of the spindle motor 44, that is, the rotating speed of the rotatable stage 41; the driving of the pulse motor 48, that is, the linear movement by the linear movement means 49; modulation of the electron beam EB; control of the deflecting means 21 and 22; and ON/OFF control of the blanking means is performed based on the reference clock signals, according to lithography data transmitted from a controller 50, which is a control means.

The disk 11, which is placed on the rotatable stage 41, is formed of silicon, glass or quartz, and has a positive type electron beam lithography resist coated thereon in advance.

Note that it is desirable for the output and beam diameter of the electron beam EB to be adjusted, taking into consideration the shapes of the elements 13 and the sensitivity of the electron beam lithography resist.

What is claimed is:

1. An electron beam lithography method, for drawing elements that constitute a transfer pattern of a master carrier for magnetic transfer, by: placing a disk, which has resist coated thereon, on a rotatable stage, which is also movable in the radial direction thereof; rotating the rotatable stage; and scanning an electron beam emitted from an electron beam lithography apparatus;

the transfer pattern comprising elements, which are formed within transfer regions of each sector of concentrically formed circumferential tracks and which have lengths in the circumferential direction that are integer multiples of a reference value;

the electron beam lithography apparatus comprising: deflecting means, for deflecting the emitted electron beam in the radial direction of the disk and also in the circumferential direction substantially perpendicular to the radial direction; and blanking means for shielding irradiation of the electron beam onto portions other than drawing portions;

the electron beam lithography method comprising the steps of:

unidirectionally rotating the disk;

repeating deflection of the electron beam in a figure 8 pattern, in which the electron beam is deflected toward the next deflection initiation point in the radial direction at track edge portions, such that the deflected directions toward the inner periphery of the disk and toward the outer periphery of the disk intersect each other;

scanning the electron beam alternately toward the inner peripheral portion and the outer peripheral portion of the rotating disk at a pitch equal to the reference value;

emitting the electron beam while operating the blanking means during deflection of the electron beam at the portions of the disk where the elements are drawn; and drawing the elements, which have lengths that are integer multiples of a reference value, by scanning the electron beam in the radial direction a number of times equal to the integer that the reference value is multiplied by.

2. An electron beam lithography method as defined in claim 1, wherein:

deflection of the electron beam in the radial direction is performed to be greater than a track width; and deflection in the circumferential direction toward the radial direction to the next deflection initiation point is performed at a track edge portion outside the track width.

3. An electron beam lithography method as defined in claim 1, wherein:

the angle between the deflection direction of the electron beam toward the outer peripheral direction and the deflection direction toward the inner peripheral direction is set according to the rotating speed of the disk, the angle of inclination of the element, and a drawing speed.

4. An electron beam lithography method as defined in claim 1, wherein:

the reference value of the drawing length in the circumferential direction of the elements is defined by an oscillation width of the electron beam, when reciprocally oscillating the electron beam at high speed in the circumferential direction, which is substantially perpendicular to the radial direction of the disk.

5. An electron beam lithography method as defined in claim 1, wherein:

the transfer pattern is a servo pattern that includes address portions.

6. An electron beam lithography method as defined in claim 2, wherein:

the angle between the deflection direction of the electron beam toward the outer peripheral direction and the deflection direction toward the inner peripheral direction is set according to the rotating speed of the disk, the angle of inclination of the element, and a drawing speed.

7. An electron beam lithography method as defined in claim 2, wherein:

the reference value of the drawing length in the circumferential direction of the elements is defined by an oscillation width of the electron beam, when reciprocally oscillating the electron beam at high speed in the circumferential direction, which is substantially perpendicular to the radial direction of the disk.

8. An electron beam lithography method as defined in claim 2, wherein:

the transfer pattern is a servo pattern that includes address portions.

9. An electron beam lithography method as defined in claim 3, wherein:

the reference value of the drawing length in the circumferential direction of the elements is defined by an oscillation width of the electron beam, when reciprocally oscillating the electron beam at high speed in the circumferential direction, which is substantially perpendicular to the radial direction of the disk.

10. An electron beam lithography method as defined in claim 3, wherein:

the transfer pattern is a servo pattern that includes address portions.

11. An electron beam lithography method as defined in claim 4, wherein:

the transfer pattern is a servo pattern that includes address portions.

* * * * *